United States Patent
Chu

(10) Patent No.: US 8,704,963 B2
(45) Date of Patent: Apr. 22, 2014

(54) THIN FILM TRANSISTOR ARRAY WHEREIN BOTH AN AUXILIARY ELECTRODE AND A STORAGE ELECTRODE ARE SHAPED AS AN OCTAGONAL RING

(75) Inventor: Tso Yu Chu, Miao-Li County (TW)

(73) Assignee: Chimei Innolux Corporation, Miao-Li County (TW)

( * ) Notice: Subject to any disclaimer, the term of this patent is extended or adjusted under 35 U.S.C. 154(b) by 389 days.

(21) Appl. No.: 12/943,948

(22) Filed: Nov. 11, 2010

(65) Prior Publication Data

US 2011/0128459 A1  Jun. 2, 2011

(30) Foreign Application Priority Data

Dec. 2, 2009 (CN) .......................... 2009 1 0310768

(51) Int. Cl.
G02F 1/1343 (2006.01)
(52) U.S. Cl.
USPC ........................................... 349/38; 349/139
(58) Field of Classification Search
USPC ..................................................... 349/38, 39
See application file for complete search history.

(56) References Cited

U.S. PATENT DOCUMENTS

| 5,913,113 | A | 6/1999 | Seo |
| 2007/0285590 | A1 | 12/2007 | Wu et al. |
| 2009/0002586 | A1* | 1/2009 | Kimura ........................... 349/39 |
| 2009/0040407 | A1* | 2/2009 | Kim ................................ 349/39 |
| 2009/0059110 | A1* | 3/2009 | Sasaki et al. .................... 349/39 |

FOREIGN PATENT DOCUMENTS

| CN | 1782825 A | 6/2006 |
| CN | 101086567 A | 12/2007 |
| CN | 101178491 A | 5/2008 |

\* cited by examiner

*Primary Examiner* — Paul Lee
(74) *Attorney, Agent, or Firm* — WPAT, PC; Justin King

(57) ABSTRACT

A thin film transistor (TFT) array substrate includes a TFT including a drain electrode having an end configured as an auxiliary electrode, a protection layer covering the thin film transistor, a storage electrode forming on the protection layer and opposite to the auxiliary electrode, a passivation layer covering the storage electrode, and a pixel electrode formed on the passivation layer. The pixel electrode is electrically coupled to the auxiliary electrode via a hole passing through the passivation layer and the protection layer. A method of manufacturing the TFT array substrate and an associated liquid crystal display are also provided.

6 Claims, 15 Drawing Sheets

THIN FILM TRANSISTOR ARRAY WHEREIN BOTH AN AUXILIARY ELECTRODE AND A STORAGE ELECTRODE ARE SHAPED AS AN OCTAGONAL RING

BACKGROUND

1. Technical Field

The present disclosure relates to flat panel display technology.

2. Description of Related Art

Liquid crystal displays (LCDs) have advantages of portability, low power consumption, and low radiation, and thus have been widely used in various portable information products.

A typical LCD includes a backlight module and an LCD panel. The backlight module provides light beams to the LCD panel. The LCD panel includes a color filter (CF) substrate, a thin film transistor (TFT) array substrate, and a liquid crystal layer sandwiched between the two substrates. When the LCD is in operation, an electric field is applied to the liquid crystal layer, and at least some of liquid crystal molecules in the liquid crystal layer change orientation such that the liquid crystal layer provides anisotropic transmittance of light therethrough. By controlling the electric field, the amount of the light beams passing through the color filter substrate can be adjusted, and thereby desired pixel colors can be obtained and a corresponding image provided by the LCD.

The TFT array substrate includes a plurality of parallel gate lines each extending along a first direction, a plurality of common lines alternately arranged with the gate lines, a plurality of parallel data lines each extending along a second direction orthogonal to the first direction, and a plurality of pixel units defined by the crossing gate lines and data lines. In particular, the smallest rectangular area formed by any two adjacent gate lines together with any two adjacent data lines defines a pixel unit thereat. Each of the common lines includes a plurality of storage electrodes, each of which is located in a respective pixel unit. The pixel unit includes a TFT, a pixel electrode, and the storage electrode. The TFT includes a gate electrode connected to the gate line, a source electrode connected to the data line, and a drain electrode connected to the pixel electrode. The pixel electrode, a common electrode of the CF substrate, and liquid crystal molecules therebetween cooperatively form a liquid crystal capacitor. The pixel electrode, the storage electrode of the common line, and medium (such as a passivation layer) therebetween cooperatively form a storage capacitor.

As described, the storage capacitor is formed by the cooperation of the pixel electrode and the storage electrode. In order to ensure that the storage capacitor has good capacitance, the storage electrode occupies a large area. Because the common line is normally metal which is lightproof, the large area of the storage electrode may cause an aperture ratio of the LCD to be low.

What is needed, therefore, is an TFT array substrate that can overcome the described limitations.

SUMMARY

According to the present disclosure, a thin film transistor (TFT) array substrate is provided. The TFT array substrate includes a TFT including drain electrode having an end configured as an auxiliary electrode, a protection layer covering the thin film transistor, a storage electrode forming on the protection layer and opposite to the auxiliary electrode, a passivation layer covering the storage electrode, and a pixel electrode formed on the passivation layer. The pixel electrode is electrically coupled to the auxiliary electrode via a hole passing through the passivation layer and the protection layer. A method of manufacturing the TFT array substrate and a liquid crystal display using the TFT array substrate are also provided.

BRIEF DESCRIPTION OF THE DRAWINGS

The components in the drawings are not necessarily drawn to scale, the emphasis instead placed upon clearly illustrating the principles of at least one embodiment. In the drawings, like reference numerals designate corresponding parts throughout the various views, and all the views are schematic.

DETAILED DESCRIPTION

Reference will now be made to the drawings to describe certain exemplary embodiments of the present disclosure in detail.

Figure 1:
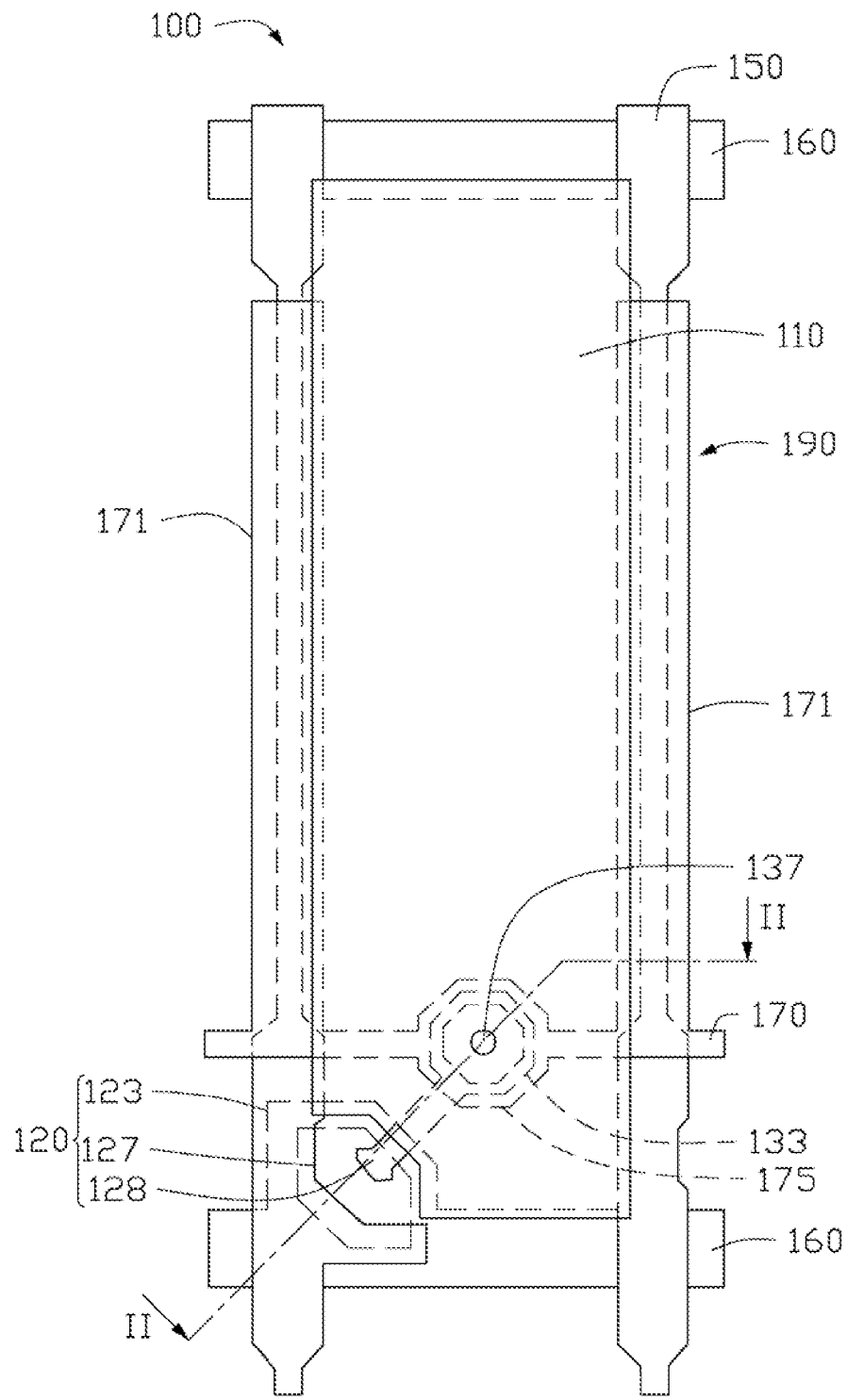
FIG. 1 is a top plan view of part of a TFT array substrate according to an embodiment of the present disclosure.
Figure 2:
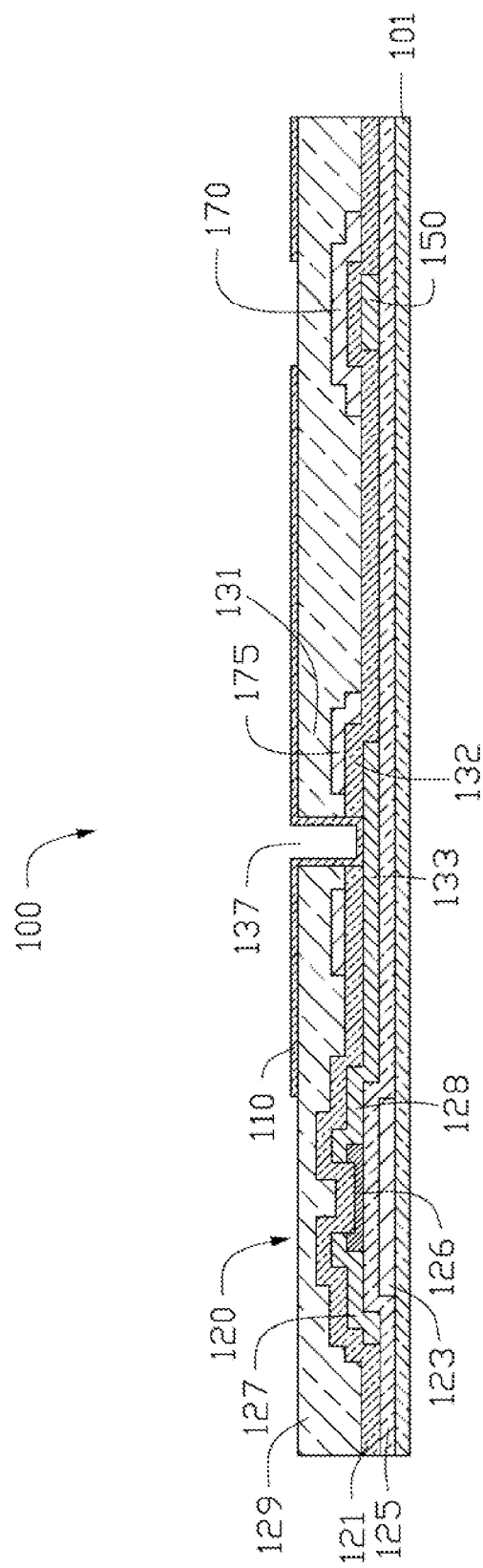
FIG. 2 is a cross-section of the TFT array substrate of FIG. 1, corresponding to line II-II.

Referring to FIGS. 1-2, a plan view and a cross-section of part of a TFT array substrate according to an embodiment of the present disclosure are shown. The TFT array substrate 100 includes a plurality of parallel gate lines 160 each extending along a first direction, a plurality of common lines 170 alternately arranged with the gate lines 160, a plurality of parallel data lines 150 each extending along a second direction orthogonal to the first direction, and a plurality of pixel regions 190 defined by the crossing gate lines 160 and data lines 150. In particular, the smallest rectangular area formed by any two adjacent gate lines 160 together with any two adjacent data lines 150 defines a pixel region thereat, and each pixel region corresponds to a respective pixel unit.

Each of the common lines 170 includes a plurality of extending electrodes 171 and a plurality of storage electrodes 175. Each of the extending electrodes 171 extends along the second direction, and is located over a respective data line 150. Each of the storage electrodes 175 is located in a respective pixel region 190. The storage electrode 175 may be generally annular. For example, in the illustration of FIG. 1, the storage electrode 175 forms an octagonal ring.

Each pixel unit includes a TFT 120, a pixel electrode 110, and the storage electrode 175. The TFT 120 is located in an intersection of the corresponding gate line 160 and date line 150, and includes a gate electrode 123 connected to the gate line 160, a source electrode 127 connected to the data line 150, and a drain electrode 128 connected to the pixel electrode 110. In particular, the drain electrode 128 extends into a position where the storage electrode 175 is located, with an end of the drain electrode 128 configured as an auxiliary electrode 133. The auxiliary electrode 133 may have an octagonal shape, and edges of the auxiliary electrode 133 are underneath the storage electrode 175, such that part of the storage electrode 175 superposes the auxiliary electrode 133.

Alternatively, the auxiliary electrode 133 and the drain electrode 128 can be two separate electrodes, both of which are formed on a same layer, and these two separated electrodes can further be electrically coupled to each other via a metal line.

Referring to FIG. 2, the TFT array substrate 100 may further include a base 101, an insulation layer 125, a semiconductor layer 126, a protection layer 121, and a passivation layer 129.

The base 101 can for example be a glass plate on which the gate electrodes 123 of the TFTs 120 and the gate lines 160 are formed. The insulation layer 125 covers the gate electrodes 123 and the gate lines 160. The semiconductor layer 126 is formed on the insulation layer 125, and faces the gate electrodes 123. The data lines 150, the source electrodes 127 and the drain electrodes 128 (including the auxiliary electrodes 133) of the TFT 120 are also formed on the insulation layer 125. In particular, the source electrodes 127 and the drain electrodes 128 are respectively formed at opposite sides of the semiconductor layer 126, and each of the source and drain electrodes 127, 128 slightly covers the semiconductor layer 126. The protection layer 121 covers the semiconductor layer 126, the source electrodes 127, the drain electrodes 128, and the data lines 150. The common lines 170 are formed on the protection layer 121, with the extending electrodes 171 superposing the data lines 150, and the storage electrodes 175 superposing the auxiliary electrodes 133. The passivation layer 129 covers the protection layer 121 and the common lines 170 including the extending electrodes 170 and the storage electrodes 175, and is configured to flatten a surface of the TFT array substrate 100. The pixel electrodes 110 are formed on the passivation layer 129.

In addition, at least one hole 137 is formed in the pixel region 190. For example, a hole 137 is formed at a center of the annular storage electrode 175, and passes through the passivation layer 129 and the protection layer 121. The pixel electrode 110 can also cover an inner surface and a bottom surface of the hole 137, thereby contacting the auxiliary electrode 133. As such, the drain electrode 128 is electrically coupled to the pixel electrode 110 by the auxiliary electrode 133.

With the configuration disclosed, in the pixel unit, the pixel electrode 110, the storage electrode 175, and the passivation layer 129 therebetween cooperatively form a first storage capacitor 131. The storage electrode 175, the auxiliary electrode 133, and the protection layer 121 therebetween cooperatively form a second storage capacitor 132. The first and second storage capacitors 131 and 132 share the storage electrode 175, and thus these two storage capacitors 131 and 132 are electrically coupled in parallel, increasing the total storage capacitance. Sharing of the storage electrode 175 between these two storage capacitors 131 and 132 means that less area is occupied by the storage electrode 175 compared with existing TFT array substrates. This provides an increased aperture ratio for any LCD which employs the TFT array substrate 100, and accordingly enables the LCD to have enhanced display quality.

Figure 3:
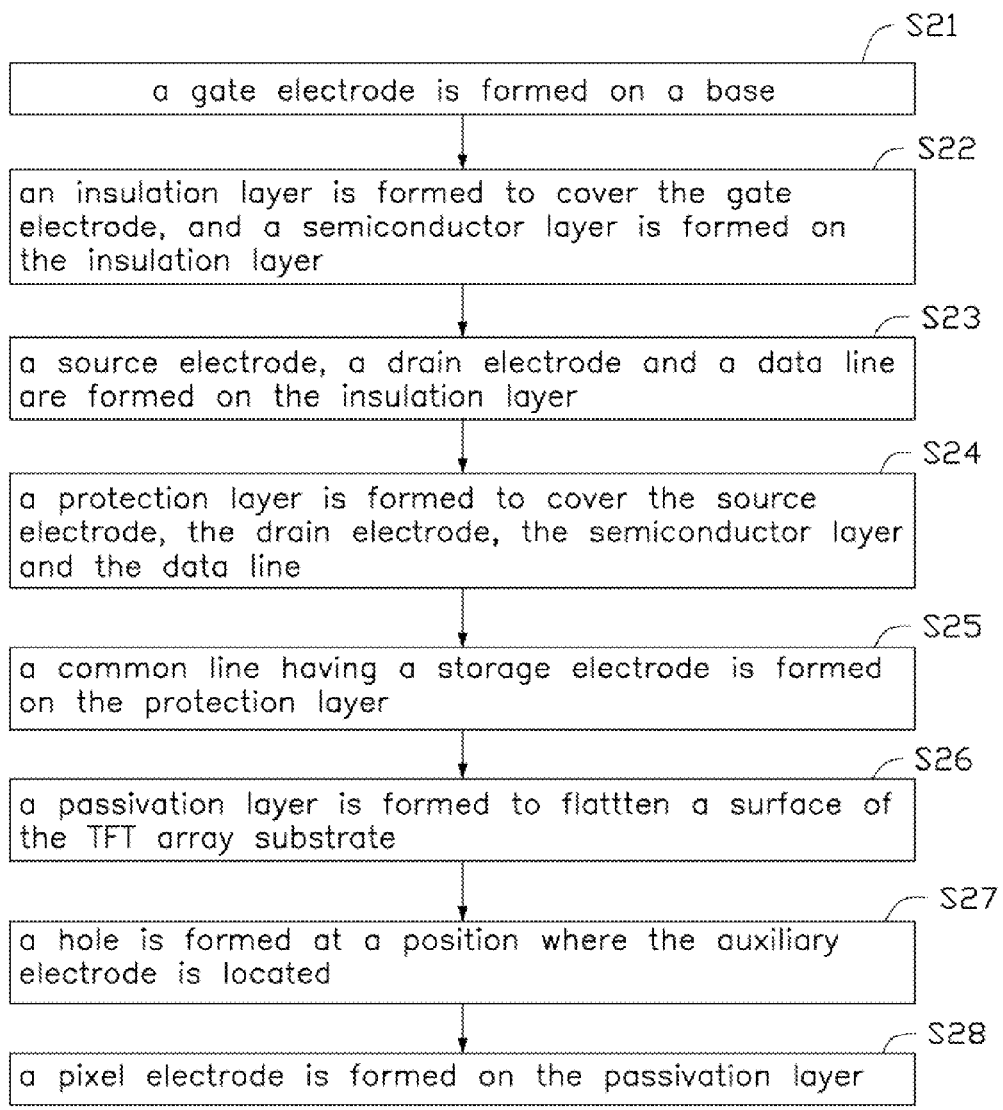
FIG. 3 is a flowchart of a method of fabricating the TFT array substrate of FIG. 1.

FIG. 3 is a flowchart of a method of fabricating the TFT array substrate 100. The method may include the following steps. In step S21, a gate electrode is formed on a base. In step S22, an insulation layer is formed to cover the gate electrode, and a semiconductor layer is formed on the insulation layer. In step S23, a source electrode, a drain electrode and a data line are formed on the insulation layer. In step S24, a protection layer is formed to cover the source electrode, the drain electrode, the semiconductor layer and the data line. In step S25, a common line having a storage electrode is formed on the protection layer. In step S26, a passivation layer is formed to flatten a surface of the TFT array substrate. In step S27, a hole is formed at a position where the auxiliary electrode is located. In step S28, a pixel electrode is formed on the passivation layer.

Figure 4:
FIGS. 4-11 are cross-sections of the TFT array substrate at different steps of the method of FIG. 3.

In step S21, a gate electrode 123 is formed on a base 101. For example, as shown in FIG. 4, a base 101, which can be a glass plate, is provided, and a first metal layer is formed on the base 101. Thereafter, a first lithography is performed on the first metal layer by use of a first photomask, so as to form the gate electrode 123 on the base 101. Moreover, during the same lithography, a gate line (not shown) can also be formed simultaneously on the base 101. In particular, such gate line can be connected to the gate electrode 123.

Figure 5:
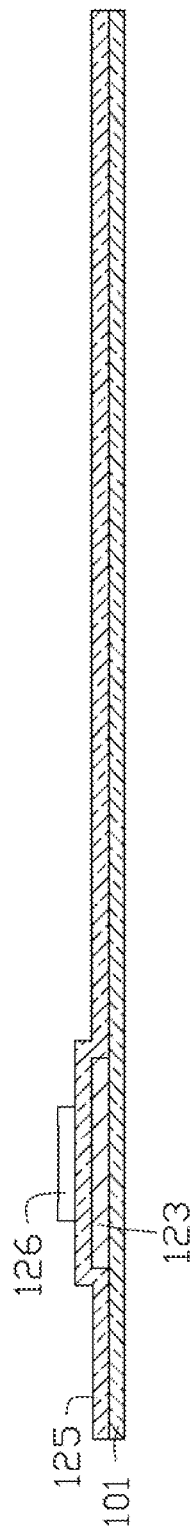

In step S22, an insulation layer 125 is formed to cover the gate electrode 123, and a semiconductor layer 126 is formed on the insulation layer 125. For example, as shown in FIG. 5, after the gate electrode 123 is formed, an insulation layer 125 can be deposited onto the base 101, and thereby the insulation layer 125 covers the gate electrode 123. Subsequently, an amorphous silicon layer is deposited onto the insulation layer 125, and then a second lithography is performed on the amorphous silicon layer by use of a second photomask, such that the semiconductor layer 126 is formed at a position opposite to the gate electrode 123. Thereafter, two predetermined regions of the semiconductor layer 126, which may be located at opposite ends of the semiconductor layer 126, are doped with impurities, for example, phosphorus ions. As such, two doped regions are formed in the semiconductor layer 126.

Figure 6:
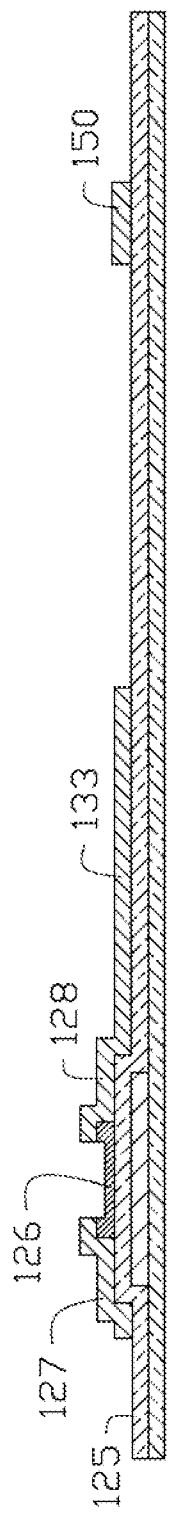

In step S23, a source electrode 127, a drain electrode 128 and a data line 150 are formed on the insulation layer 125. For example, as shown in FIG. 6, after the semiconductor layer 126 is formed, a second metal layer can be deposited on the insulation layer 125, and thereby the semiconductor layer 126 is covered by the second metal layer. After that, a third lithography is performed on the second metal layer by use of a third photomask, such that a source electrode 127 and a drain electrode 128 are formed on the insulation layer 125, with each of the source and drain electrodes 127, 128 adjacent to a respective doped region of the semiconductor layer 126. Moreover, the third photomask can be patterned such that the formed source electrode 127 and drain electrode 128 cover opposite edges of the semiconductor layer 126, and additionally the formed drain electrode 128 has an octagonal end which can serve as an auxiliary electrode 133. As such, a TFT (not labeled) is formed in the TFT array substrate 100. Furthermore, during the same lithography, a data line 150 can also be formed simultaneously on the insulation layer 125.

Figure 7:
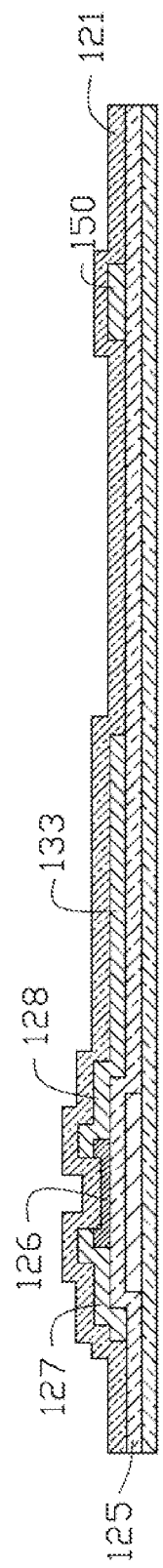

In step S24, a protection layer 121 is formed to cover the source electrode 127, the drain electrode 128, the semiconductor layer 126, and the data line 150. For example, as shown in FIG. 7, after the source electrode 127, the drain electrode 128 and the data line 150 are formed, the protection layer 121 can be deposited so as to cover and protect the TFT.

Figure 8:
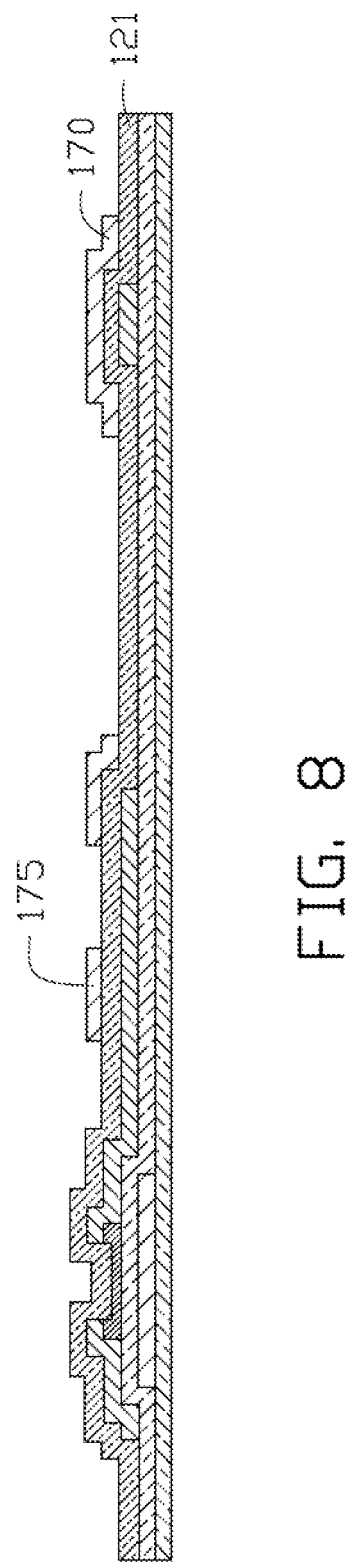

In step S25, a common line 170 having a storage electrode 175 is formed on the protection layer 121. For example, as shown in FIG. 8, a third metal layer can be deposited on the protection layer 121. Then a fourth lithography is performed on the third metal layer by use of a fourth photomask, such that after the third metal layer is etched, a common line 170 is formed over the auxiliary electrode 133. In particular, the fourth photomask can be designed (configured) in such a way that the formed common line 170 has a storage electrode 175 having, for example, an octagonal ring shape. Furthermore, by use of the fourth photomask, during the same lithography, an extending electrode 171 of a part of the common line 170 is also formed on the protection layer 121, and covers the data line 150.

Figure 9:
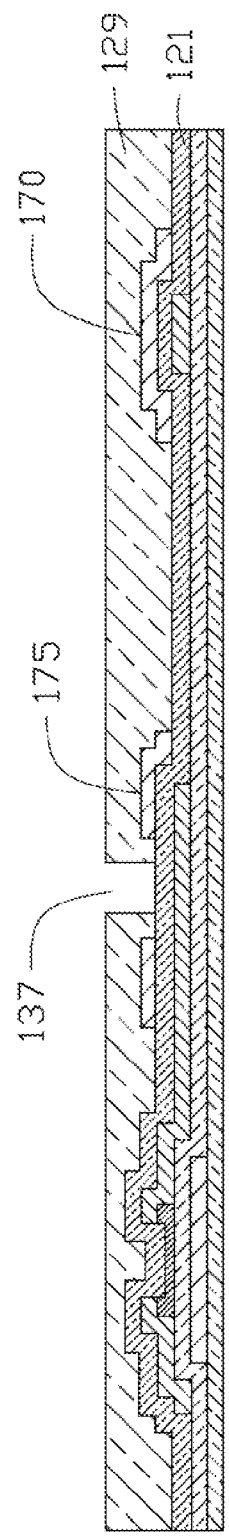

In step S26, a passivation layer 129 is formed to flatten a surface of the TFT array substrate 100. For example, as shown in FIG. 9, after the common line 170 is formed, a passivation layer 129 can be deposited on the protection layer 121, flattening a surface of the TFT array substrate 100.

Figure 10:
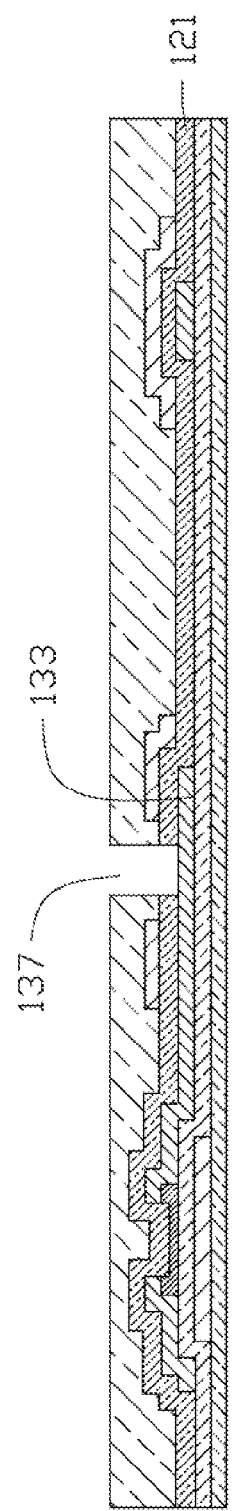

In step S27, a hole 137 is formed at a position where the auxiliary electrode 133 is located. For example, as shown in FIG. 9, after the passivation layer 129 is formed, a fifth lithography is performed on the passivation layer 129 by use of a fifth photomask, such that part of the hole 137 is formed at a position where the auxiliary electrode 133 is located. As shown in FIG. 10, a sixth photomask is performed to etch the protection layer 121, such that the entire hole 137 is formed. In particular, the hole 137 passes through the passivation layer 129 at a center of the annular storage electrode 175, and further through the protection layer 121, and then ends at the surface of the auxiliary electrode 133. Due to the hole 137, the auxiliary electrode 133 is bared.

Figure 11:
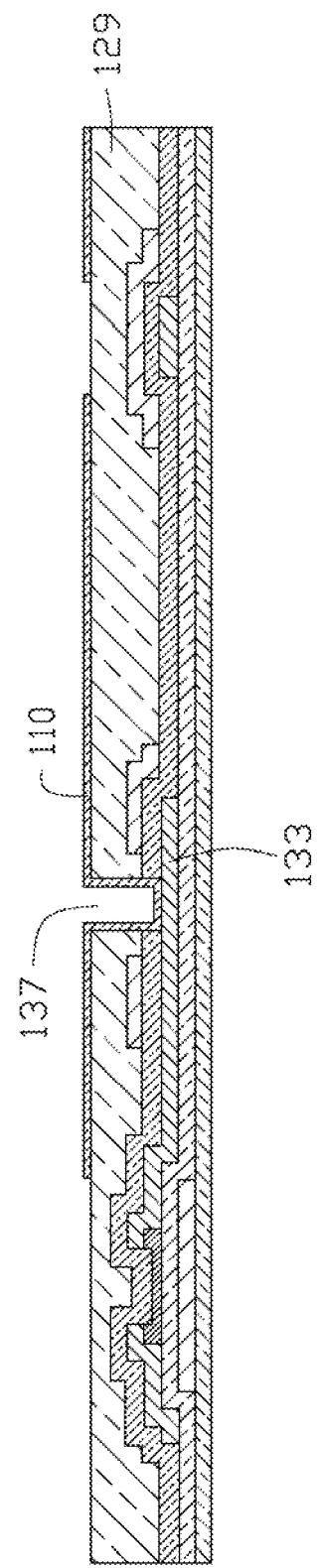

In step S28, a pixel electrode 110 is formed on the passivation layer 129. For example, as shown in FIG. 11, after the hole 137 is etched, a transparent conductive layer is formed on the passivation layer 129, contacting the auxiliary electrode 133 via the hole 137. Thereafter, a sixth lithography is performed on the transparent conductive layer by use of a sixth photomask, such that a pixel electrode 110 is formed on the passivation layer 129 at a predetermined region. As such, the pixel electrode 110 superposes the storage electrode 175, and is electrically coupled to the auxiliary electrode 133 via the hole 137.

In the exemplary embodiment, the material of all the metal layers can include molybdenum. With such material, each of the edges of the electrodes obtained from the lithographies has a shape substantially defined by right angles, as shown in FIGS. 4-11.

Figure 12:
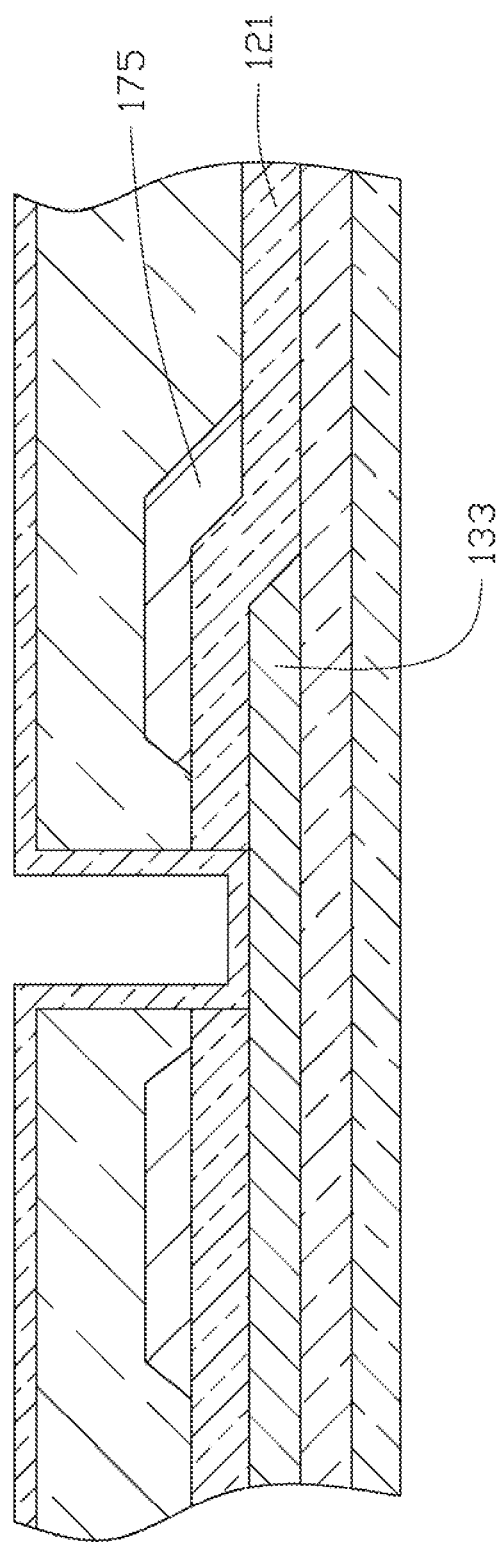
FIG. 12 is a cross-section of part of a TFT array substrate according to another embodiment of the present disclosure.

In alternative embodiments, the material of any selected of the metal layers can be substituted with a metal alloy, such as alloy of molybdenum, aluminum, or niobium. In such alternative embodiments, typically, the edges of the electrodes obtained from the lithographies have shape substantially defined by oblique surfaces, as shown in FIG. 12. The oblique surfaces can protect patterns of the electrodes from breaking off, thereby improving a reliability of the TFT array substrate.

Figure 13:
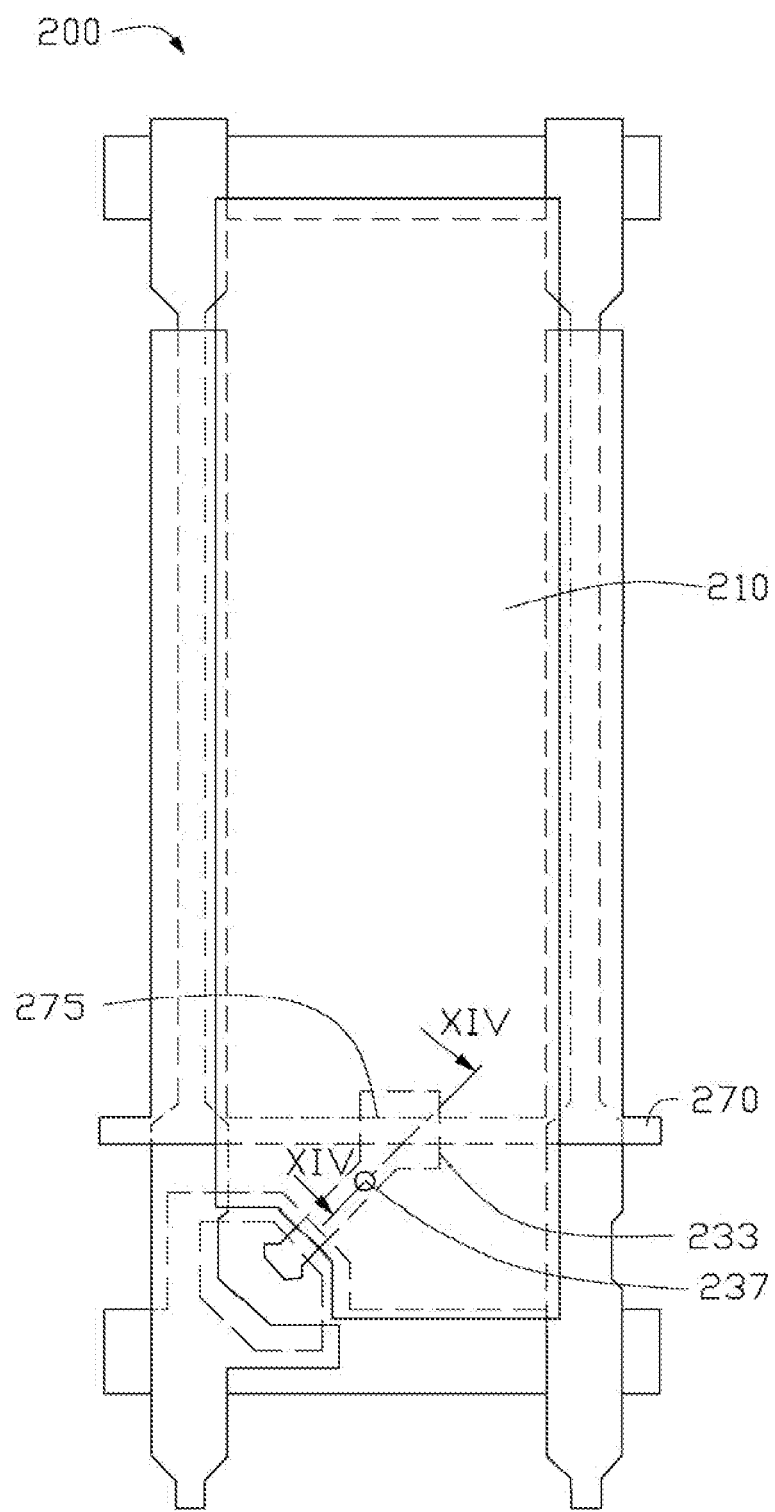
FIG. 13 is a top plan view of part of a TFT array substrate according to yet another embodiment of the present disclosure.
Figure 14:
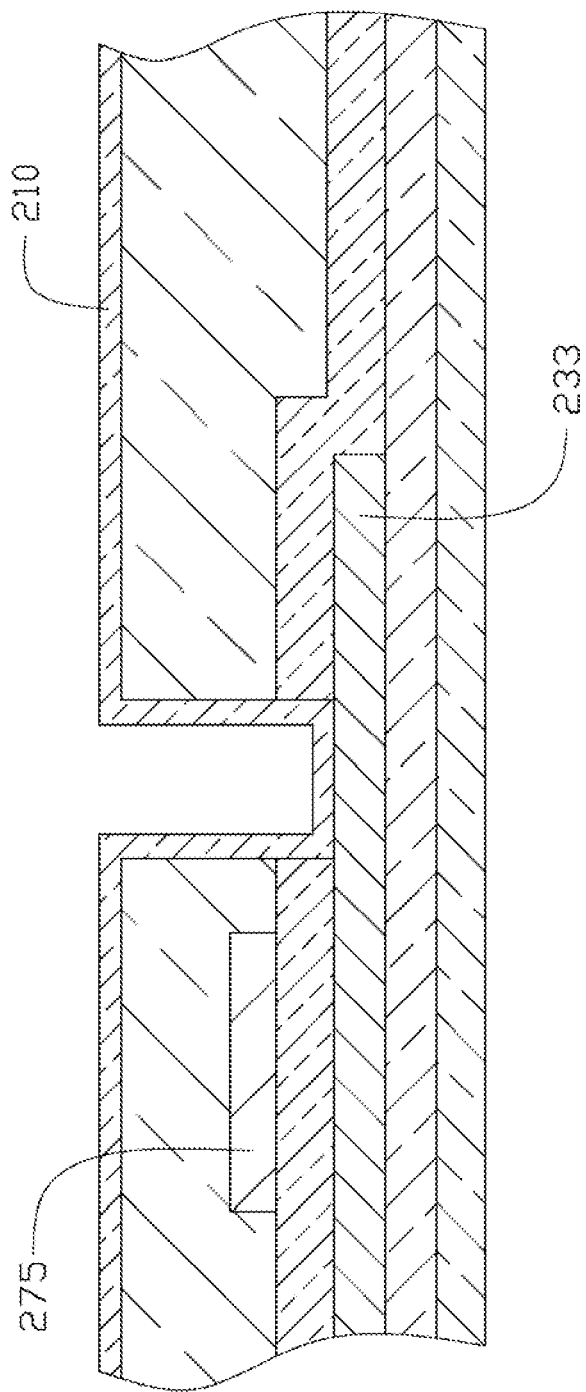
FIG. 14 is a cross-section of the TFT array substrate of FIG. 13, corresponding to line XIV-XIV.

Referring to FIGS. 13-14, a plan view and cross-section of part of a TFT array substrate 200 according to another embodiment of the present disclosure are shown. The TFT array substrate 200 differs from the TFT array substrate 100 only in that a storage electrode 275 of a common line 270 in each pixel unit has a rectangular shape rather than an annular shape, as does an auxiliary electrode 233 extending from a drain electrode of a TFT. Moreover, a hole 237 is located at a side of the storage electrode 275, and a pixel electrode 210 is electrically coupled to an edge of the auxiliary electrode 233 via the hole 237.

Figure 15:
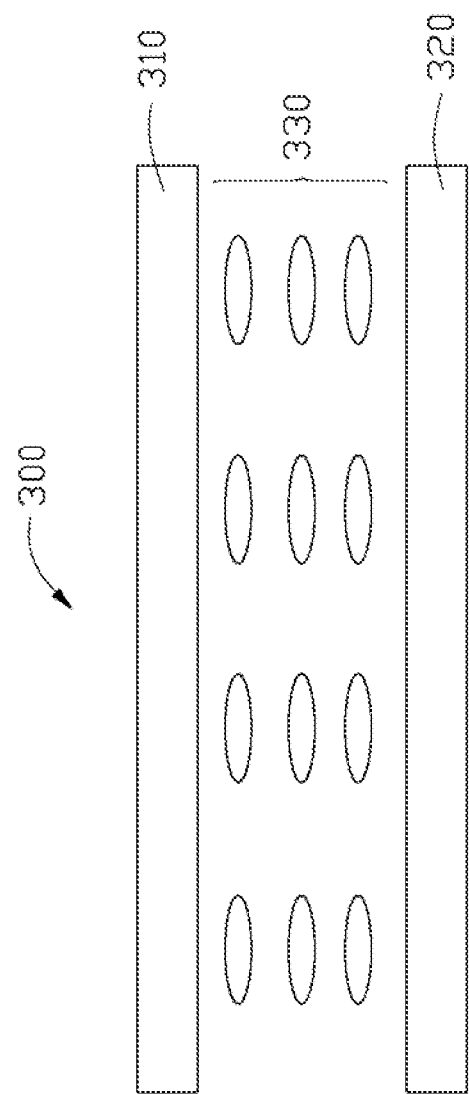
FIG. 15 is a schematic side cross-section of part of a liquid crystal display according to an embodiment of the present disclosure.

FIG. 15 is a side cross-section of a liquid crystal display according to an embodiment of the present disclosure. The liquid crystal display 300 includes a color filter (CF) substrate 310, a TFT array substrate 320, and a liquid crystal layer 330 sandwiched between the two substrates 310 and 320. The TFT array substrate 320 can be any one of the TFT array substrates disclosed herein. When the liquid crystal display 300 is in operation, an electric field is applied to liquid crystal molecules of the liquid crystal layer 330, and at least some of the liquid crystal molecules change orientation such that the liquid crystal layer 330 provides anisotropic transmittance of light therethrough. By controlling the electric field, the amount of light passing through the CF substrate 310 can be adjusted, and thereby desired pixel colors can be obtained and a corresponding image provided by the liquid crystal display 300.

It is to be further understood that even though numerous characteristics and advantages of preferred and exemplary embodiments have been set out in the foregoing description, together with details of the structures and functions of the embodiments, the disclosure is illustrative only; and that changes may be made in detail, especially in matters of shape, size and arrangement of parts within the principles of the present disclosure to the full extent indicated by the broad general meaning of the terms in which the appended claims are expressed.

What is claimed is:

1. A thin film transistor array substrate, comprising:
    a base;
    a thin film transistor formed on the base, the thin film transistor comprising a drain electrode, wherein the drain electrode has an end defined as an auxiliary electrode;
    a protection layer covering the thin film transistor;
    a storage electrode formed on the protection layer, opposite to the auxiliary electrode, wherein the storage electrode is inside of a pixel region, made of metal material;
    a passivation layer covering the storage electrode; and
    a pixel electrode formed on the passivation layer, the pixel electrode electrically coupled to the auxiliary electrode via a hole passing through the passivation layer and the protection layer, wherein the hole is formed at a position corresponding to a center of the storage electrode;
    wherein both the auxiliary electrode and the storage electrode are shaped as an octaganal ring, and edges of the auxiliary electrode are located underneath the storage electrode.

2. The thin film transistor array substrate of claim 1, wherein the pixel electrode superposes the storage electrode, and cooperates with the passivation layer to form a first storage capacitor, the storage electrode superposes the auxiliary electrode, and cooperates with the protection layer to form a second storage capacitor, and the first and second storage capacitors are electrically coupled in parallel.

3. The thin film transistor array substrate of claim 1, further comprising a gate line and a data line electrically coupled to a gate electrode and a source electrode of the thin film transistor, respectively, and a common line adjacent to the gate line, wherein the storage electrode is a part of the common line, and the common line further comprises an extending electrode superposing the data line.

4. The thin film transistor array substrate of claim 1, wherein the storage electrode has an approximately rectangular shape, and the hole is located at a side of the storage electrode.

5. The thin film transistor array substrate of claim 1, wherein the auxiliary electrode and the storage electrode are both made of molybdenum.

6. The thin film transistor array substrate of claim 1, wherein each of the auxiliary electrode and the storage electrode is made of material selected from the group consisting of molybdenum, aluminum, niobium, and any alloy thereof.

* * * * *